United States Patent
Kao et al.

(10) Patent No.: US 8,395,149 B2
(45) Date of Patent: Mar. 12, 2013

(54) SEMICONDUCTOR DEVICE STRUCTURE AND METHOD FOR MANUFACTURING THE SAME

(75) Inventors: Yih-Chyun Kao, Hsin-Chu (TW); Chun-Nan Lin, Hsin-Chu (TW); Li-Kai Chen, Hsin-Chu (TW); Wen-Ching Tsai, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 374 days.

(21) Appl. No.: 12/776,484

(22) Filed: May 10, 2010

(65) Prior Publication Data

US 2011/0147733 A1 Jun. 23, 2011

(30) Foreign Application Priority Data

Dec. 22, 2009 (TW) .............................. 98144288 A

(51) Int. Cl.
 *H01L 29/786* (2006.01)
 *H01L 29/12* (2006.01)

(52) U.S. Cl. ...................... 257/43; 257/57; 257/E21.46; 257/E29.068; 257/59

(58) Field of Classification Search .................. 257/43, 257/E29.296, E21.46, E29.068, 57
See application file for complete search history.

(56) References Cited

U.S. PATENT DOCUMENTS

| | | | |
|---|---|---|---|
| 6,806,148 B1 | 10/2004 | Choi et al. | |
| 7,368,751 B2 | 5/2008 | Young et al. | |
| 2006/0019502 A1 | 1/2006 | Park et al. | |
| 2007/0072439 A1 | 3/2007 | Akimoto et al. | |
| 2007/0152921 A1 | 7/2007 | Osame | |
| 2008/0009108 A1* | 1/2008 | Lin et al. | 438/158 |
| 2008/0272370 A1 | 11/2008 | Endo et al. | |
| 2008/0291350 A1 | 11/2008 | Hayashi et al. | |
| 2009/0057668 A1* | 3/2009 | Chen et al. | 257/59 |
| 2009/0101903 A1* | 4/2009 | Chen et al. | 257/59 |

* cited by examiner

*Primary Examiner* — Mamadou Diallo
(74) *Attorney, Agent, or Firm* — WPAT PC; Justin King

(57) ABSTRACT

A semiconductor device structure on a substrate and a manufacture method thereof is provided. The semiconductor device structure includes an oxide semiconductor transistor and a passivation layer containing free hydrogen. The semiconductor device structure is formed by following steps. A gate electrode is formed on the substrate. A gate dielectric layer covers the gate electrode. A source electrode is formed on the gate dielectric layer. A drain electrode is formed on the gate dielectric layer and separated from the source electrode and thereby forming a channel distance. An oxide semiconductor layer is formed on the gate dielectric layer, the source electrode and the drain electrode and between the source electrode and the drain electrode. The oxide semiconductor layer is further electrically connected with the source electrode and the drain electrode. A passivation layer covers the oxide semiconductor layer, the source electrode and the drain electrode. The passivation layer has a groove formed therein, and the groove surrounds the oxide semiconductor layer.

20 Claims, 10 Drawing Sheets

SEMICONDUCTOR DEVICE STRUCTURE AND METHOD FOR MANUFACTURING THE SAME

CROSS-REFERENCE TO RELATED APPLICATIONS

This application claims the right of priority based on Taiwan Patent Application No. 098144288 entitled "Semiconductor Device Structure and Method for Manufacturing the Same", filed on Dec. 22, 2009, which is incorporated herein by reference and assigned to the assignee herein.

BACKGROUND

1. Technical Field

The present invention relates to an oxide semiconductor transistor and a method for manufacturing the same, and particularly to a thin film transistor array for a display panel and a method for manufacturing the same.

2. Related Art

For semiconductor devices (e.g. thin film transistors) that employ oxide semiconductors, for example, indium gallium zinc oxide (InGaZnO), served as a channel layer, the characteristic thereof may change due to the influence of the ambient gas (for example, the silicone used in the manufacturing process of silicon oxide layer or silicon nitride layer) to the channel layer. For example, if the InGaZnO layer contacts with the films containing free hydrogen (such as the gate dielectric layer and the gate passivation layer), the free hydrogen in the films will spread into the InGaZnO layer after the semiconductor device is annealed for a long time such that the InGaZnO layer intends to be electrically conductive. In other words, the oxygen in the InGaZnO layer is reduced by the free hydrogen into oxygen vacancies thereby improving the conductivity of the InGaZnO layer, and the threshold voltage of the thin film transistors accordingly offset to negative values.

BRIEF SUMMARY

The present invention relates to a semiconductor device structure having improved semiconductor characteristic.

The present invention also relates to a method for manufacturing the semiconductor device structure which can improve the performance of the semiconductor device structure.

An embodiment of the present invention provides a semiconductor device structure on a substrate, which includes a gate electrode, a first dielectric layer containing free hydrogen, a source electrode, a drain electrode, an oxide semiconductor layer, and a second dielectric layer containing dielectric layer. The gate electrode is formed on the substrate, the first dielectric layer covers the gate electrode, the source electrode is formed on the first dielectric layer, the drain electrode is formed on the first dielectric layer and is separated from the source electrode and thereby forming a channel distance, the oxide semiconductor layer is formed on the first dielectric layer, the source electrode and the drain electrode, and can also be formed between the source electrode and the drain electrode. The oxide semiconductor layer can be further electrically connected to the source electrode and the drain electrode. The second dielectric layer covers the oxide semiconductor layer, the source electrode and the drain electrode. The second dielectric layer defines a first groove surrounding the oxide semiconductor layer.

In another embodiment of the present invention, the oxide semiconductor layer includes InGaZnO.

In another embodiment of the present invention, the first dielectric layer defines a second groove connected to the first groove, and the second groove exposes a portion of the gate electrode at a bottom thereof.

In another embodiment of the present invention, the semiconductor device structure further includes a third dielectric layer formed on the second dielectric layer. The first groove and the second groove are filled with the third dielectric layer.

In another embodiment of the present invention, the third dielectric layer is comprised of polyimide.

In another embodiment of the present invention, the semiconductor device structure further includes a patterned transparent conductive layer formed on the second dielectric layer and disposed in the first groove and the second groove.

In another embodiment of the present invention, the patterned transparent conductive layer is comprised of indium tin oxide (ITO).

In another embodiment of the present invention, the patterned transparent conductive layer penetrates the first groove and the second groove to electrically connect to the gate electrode.

In another embodiment of the present invention, the first groove includes a first sub opening and a second sub opening spaced apart from each other, and the first sub opening and the second sub opening is respectively disposed at two opposite sides of the oxide semiconductor layer.

In another embodiment of the present invention, the content of the free hydrogen in the second dielectric layer is greater than that of the first dielectric layer.

Another embodiment of the present invention also provides a semiconductor device structure on a substrate, which includes a transistor formed on the substrate. The transistor includes a gate electrode, a source electrode, a drain electrode, an oxide semiconductor layer, a gate dielectric layer and a passivation layer containing free hydrogen. The gate electrode is formed on the substrate. The source electrode and the drain electrode are both on the substrate the source electrode is separated from the drain electrode, and thereby forming a channel distance. The oxide semiconductor layer can be formed between the source electrode and the drain electrode, and are electrically connected to the source electrode and the drain electrode, respectively. The gate dielectric layer is formed between the gate electrode and the oxide semiconductor layer, and between the source electrode and the drain electrode. The passivation layer is formed on the gate electrode, the gate dielectric layer, the source electrode, the drain electrode, and the oxide semiconductor layer. At least one of the gate dielectric layer and the passivation layer has a groove at a periphery of the oxide semiconductor layer and surrounding the oxide semiconductor layer.

Still another embodiment of the present invention also provides a method for manufacturing a semiconductor device structure, which includes the steps of: forming a gate electrode on a substrate; forming a first dielectric layer containing free hydrogen to cover the gate electrode; forming a source electrode and a drain electrode on the first dielectric layer, the source electrode is separated from the drain electrode and thereby forming a channel distance; forming an oxide semiconductor layer on the first dielectric layer, the source electrode, and the drain electrode, or between the source electrode and the drain electrode; forming a second dielectric layer containing free hydrogen on the first dielectric layer, the oxide semiconductor layer, the source electrode and the drain electrode; and etching the second dielectric layer to form a groove surrounding the oxide semiconductor layer.

In another embodiment of the present invention, the method further includes etching through the second dielectric layer and the first dielectric layer by using the gate electrode as an etching stop layer.

In another embodiment of the present invention, the method further includes forming a third dielectric layer on the second dielectric layer and disposing the third dielectric layer in the groove.

In another embodiment of the present invention, the method further includes forming a transparent conductive layer on the second dielectric layer and disposing the transparent conductive layer in the groove. In addition, the transparent conductive layer can electrically connect to the gate electrode through the groove.

The present invention utilize the groove at least in the second dielectric layer containing free hydrogen or the passivation layer to block the spreading path of the free hydrogen to the oxide semiconductor layer. The oxide semiconductor layer does not be oxidized by the free hydrogen, or is just slightly oxidized by the free hydrogen. As such, the performance of the oxide semiconductor layer can be kept in the manufacturing process of the semiconductor device structure. Therefore, the semiconductor device structure of the embodiments of the present invention has better performance.

Other aspects, details, and advantages of the present display device are further described in detail accompanying with preferred embodiments and figures as follows.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Hereinafter, the semiconductor device structure and the method for manufacturing the same of the present invention will be described in detail referring to embodiments accompanying with figures. However, the illustrated embodiments are not intended to be used to limit the scope of the present invention, and the description of the structure and operating procedure are not intended to be used to limit the operation procedure of the present invention. Any structure obtained from re-assembling the features and having equivalent functions are both the scope of the present invention. The figures are illustrative and are not drawn according to actual scales.

Figure 1:
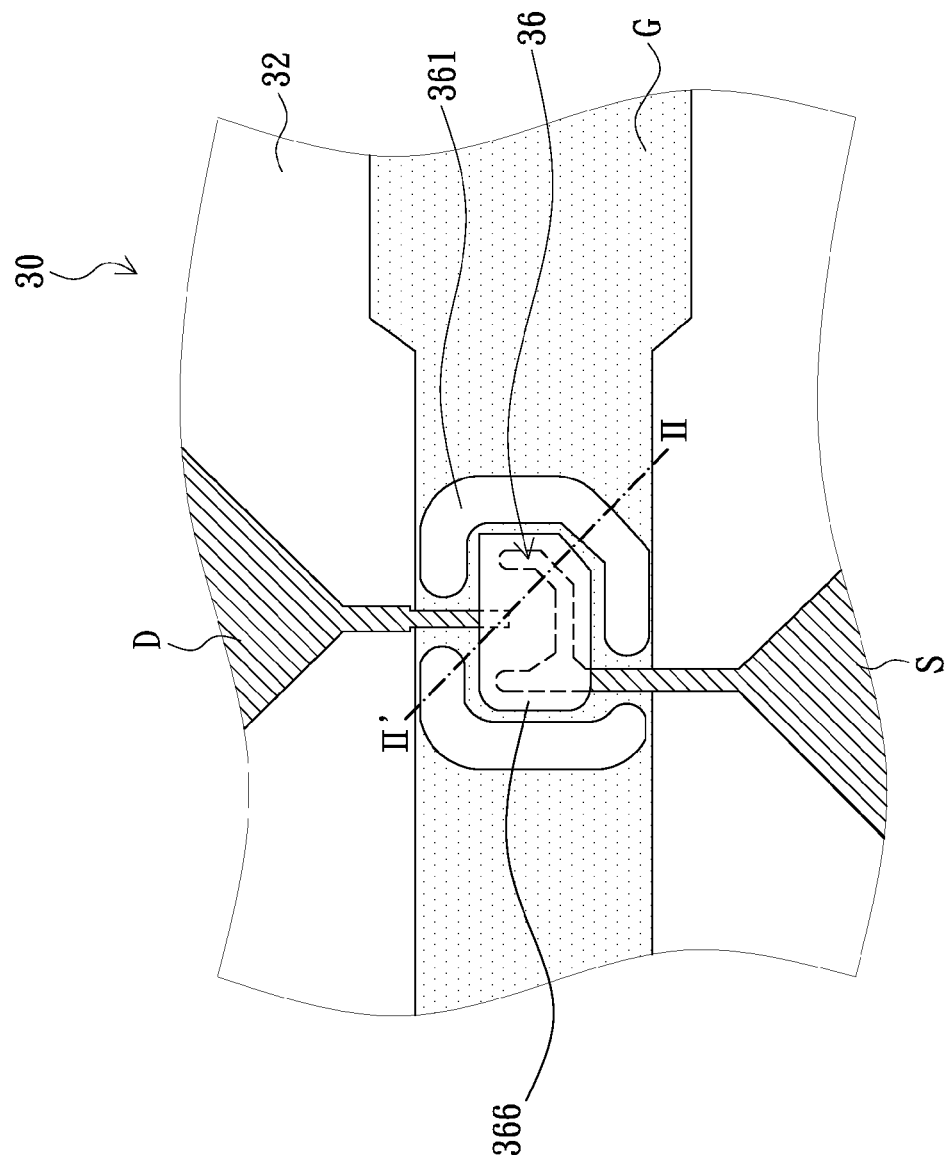
FIG. 1 is a partial schematic view showing a semiconductor device structure in accordance with an embodiment of the present invention.
Figure 2:
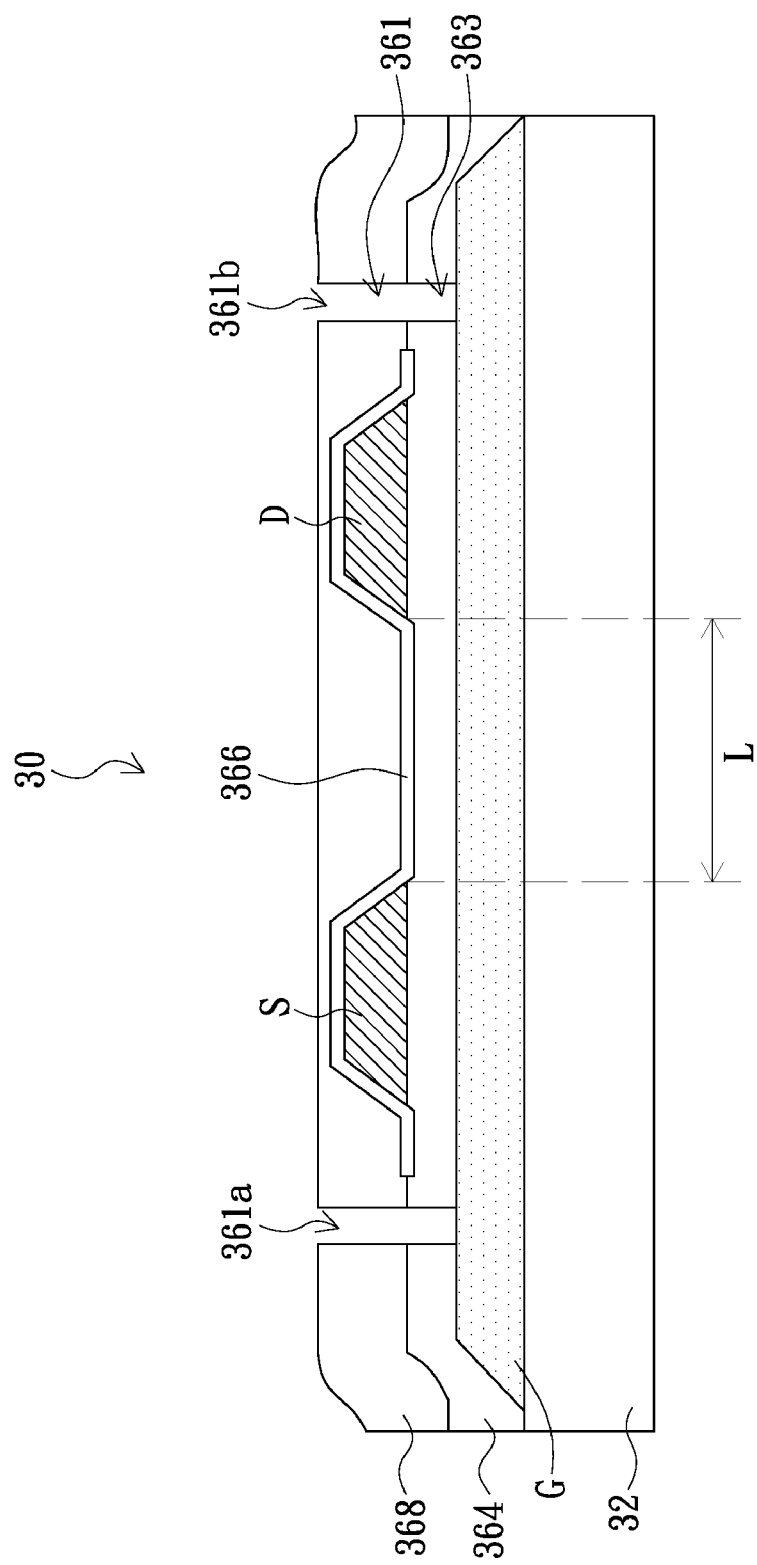
FIG. 2 is a cross sectional view taken along the line II-II' of FIG. 1.

Referring to FIGS. 1 and 2, FIG. 1 is a partial schematic view showing a semiconductor device structure in accordance with an embodiment of the present invention, and FIG. 2 is a cross sectional view taken along the line II-II' of FIG. 1. To clearly show the relative position of the parts, an oxide semiconductor layer 366 in the FIG. 1 is drawn in a perspective manner. However, in practical, the oxide semiconductor layer 366 is not limited to be transparent.

As shown in FIG. 1, a semiconductor device structure 30 includes a substrate 32 and a transistor 36 formed on the substrate 32. In the present embodiment, the transistor 36 defines grooves 361 and 363. Referring together to FIGS. 1 and 2, the transistor 36 includes a gate electrode G, a gate dielectric layer 364, a source electrode S, a drain electrode D, an oxide semiconductor layer 366, and a passivation layer 368. The gate dielectric layer 364 and the passivation layer 368 can comprise dielectric materials such as silicon oxide, silicon nitride or combination thereof, and may further comprise free hydrogen due to the manufacturing process. In particular, the content of free hydrogen in the passivation layer 368 is generally greater than that of the gate dielectric layer 364.

Continuously, the gate electrode G is on the substrate 32, the gate dielectric layer 364 covers the gate electrode G, the source electrode S is on the gate dielectric layer 364, and the drain electrode D is on the gate dielectric layer 364 and is separated from the source electrode S thereby forming a channel distance L. The groove 363 is in the gate dielectric layer 364 and includes two sub openings (not shown) apart from each other. The two sub openings are respectively located at two opposite sides of the oxide semiconductor layer 366. In addition, the groove 363 exposes a portion of the gate electrode G at a bottom there of. Additionally, the groove 363 is located at a periphery of the oxide semiconductor layer 366 and surrounds the oxide semiconductor layer 366.

The oxide semiconductor layer 366 is formed on the gate dielectric layer 364, the source electrode S and the drain electrode D, and is between the source electrode S and the drain electrode. The oxide semiconductor layer 366 is electrically connected to the source electrode S and the drain electrode D. The oxide semiconductor layer 366 can comprise any appropriate oxide semiconductor material, for example, indium gallium zinc oxide (IGZO), zinc oxide (ZnO), zinc tin oxide (ZnSnO), other similar material, or combination thereof, and thus having the advantage of high mobility. The oxide semiconductor layer 366 constitutes the channel layer of the transistor 36, and the length of the channel layer is L. It is necessary to note that aforementioned "the oxide semiconductor layer 366 is between the source electrode S and the drain electrode D" includes two situations: (1) as shown in FIG. 2, the oxide semiconductor layer 366 is partially disposed between the source electrode S and the drain electrode D; and (2) the oxide semiconductor layer 366 is disposed only between the source electrode S and the drain electrode D (not shown).

The passivation layer 368 covers the oxide semiconductor layer 366, the source electrode S and the drain electrode D. The groove 361 is in the passivation layer 368 and is connected to the groove 363. The groove 361 includes two sub openings 361a and 361b that are apart from each other. The two sub openings 361a and 361b are respectively located at two opposite sides of the oxide semiconductor layer 366. In addition, the groove 361 is at a periphery of the oxide semiconductor layer 366 and surrounds the oxide semiconductor layer 366.

In other embodiments, because the content of the free hydrogen in the gate dielectric layer 364 is relatively low, the influence of the free hydrogen to the characteristic of the semiconductor device structure 30 is relatively slight. Thus, in the applications that don't require high performance of the semiconductor device structure 30, or the content of the free hydrogen in the gate dielectric layer 364 is extremely low, the groove 361 can only be formed in the passivation layer 368 and there is on groove 363 formed in the gate dielectric layer 364.

Figure 3:
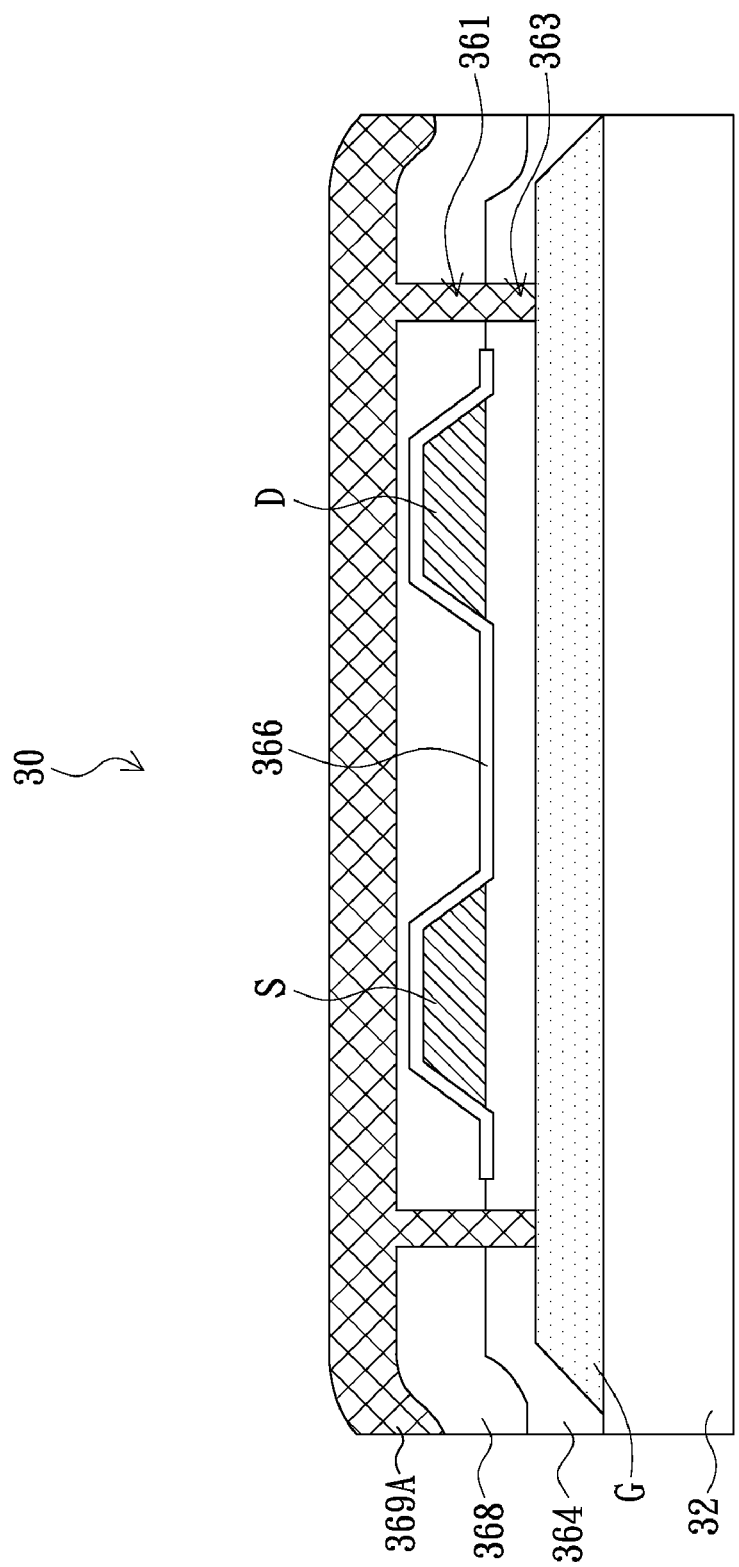
FIG. 3 is a cross sectional view of a semiconductor device structure in accordance with another embodiment of the present invention.

In other embodiments, as shown in FIG. 3, the semiconductor device structure 30 of the present embodiment can further include dielectric layer 369A formed on the passivation layer 368 and is disposed in the grooves 361 and 363. Here, the dielectric layer 369A is a filling material of the grooves 361 and 363, and can comprise a material that doesn't contain free hydrogen such as polyimide. In the present embodiment, when the semiconductor device structure 30 is applied in thin film transistor liquid crystal display device (TFT-LCD), the dielectric layer 369A is helpful to form pixel electrodes in the continuous process.

Figure 4:
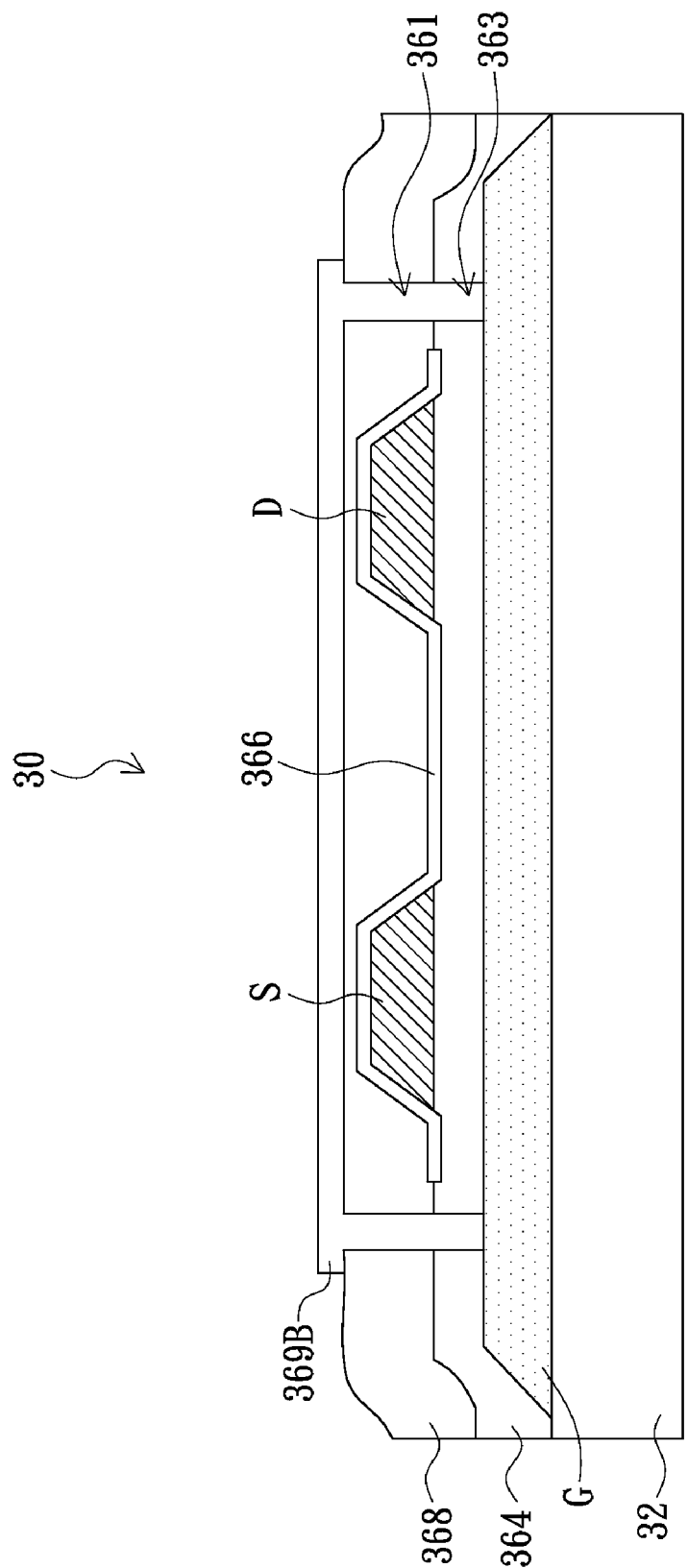
FIG. 4 is a cross sectional view of a semiconductor device structure in accordance with still another embodiment of the present invention.

In other embodiments, as shown in FIG. 4, the semiconductor device structure 30 of the present embodiment can also further include a patterned transparent conductive layer 369B formed on the passivation layer 368 and is disposed in the grooves 361 and 363. The patterned transparent conductive layer 369B can comprise indium tin zinc oxide or other similar materials. In this situation, the patterned transparent conductive layer 369B penetrates through the grooves 361, 363 to electrically connect to the gate electrode G thereby acting as the top gate electrode of the transistor 36, and the gate electrode G acts as the bottom gate electrode of the transistor 36. In other words, the transistor 36 is a double gate transistor. In other embodiments, the patterned transparent conductive layer 369b can also only be disposed in the grooves 361, 363, and doesn't cover the top of the source electrode S and the drain electrode D. That is, the grooves 361, 363 are only filled with the patterned transparent conductive layer 369B but not to constitute a double gate structure.

Hereinafter, a method for manufacturing a semiconductor device structure in accordance with an embodiment of the present invention will be described in detail accompanying with FIGS. 5A-5E. FIGS. 5A-5E illustrates the manufacturing process of the semiconductor device structure provided in the above embodiments of the present invention.

Figure 5A:
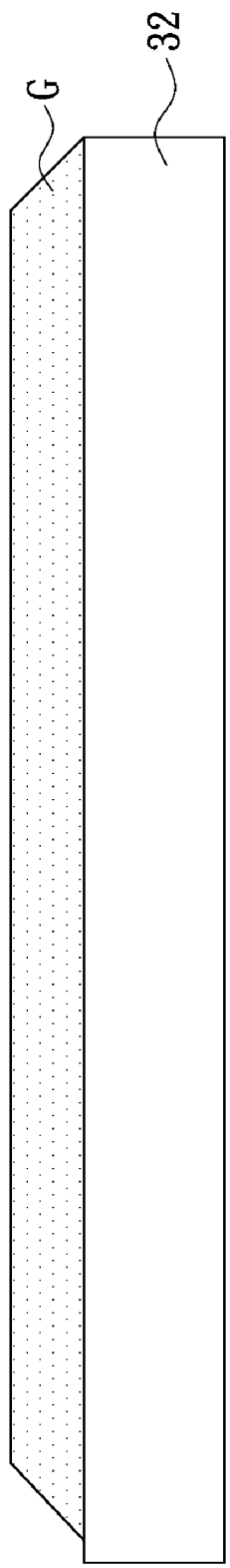
FIGS. 5A-5E are schematic views showing a method for manufacturing a semiconductor device structure in accordance with an embodiment of the present invention.

As shown in FIG. 5A, firstly, a gate electrode G is formed on the substrate 32. The gate electrode G can comprise a material having high electrical conductivity, for example, metals. The substrate 32 can comprise a transparent material having high light transmittance such as glass or acrylic resin.

Figure 5B:
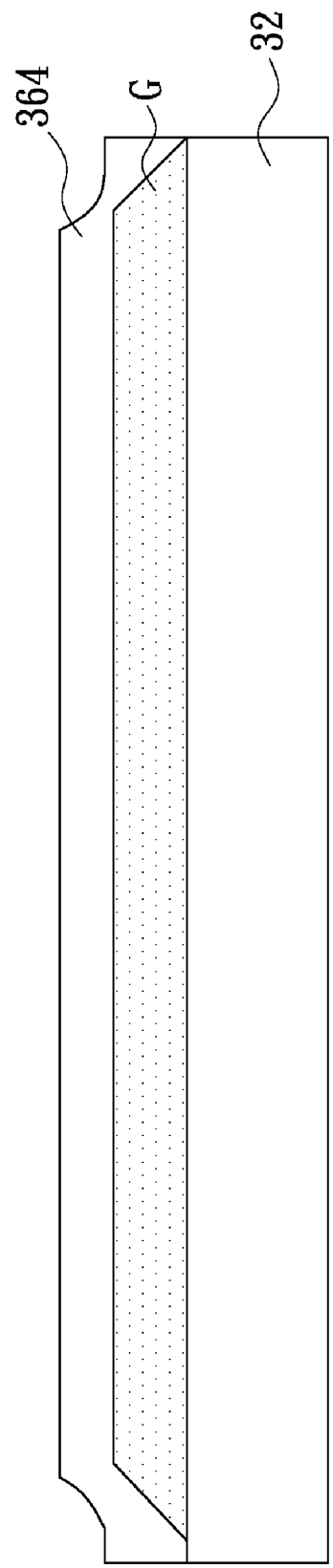

As shown in FIG. 5B, then a gate dielectric layer 364 is formed on the gate electrode G. The gate dielectric layer 364 covers the gate electrode G, and can comprise silicon oxide, silicon nitride, silicon oxynitride, or combination thereof. Due to the employed manufacturing process, for example, silicone is used in the manufacturing process; the gate electrode 364 usually contains free hydrogen therein.

Figure 5C:
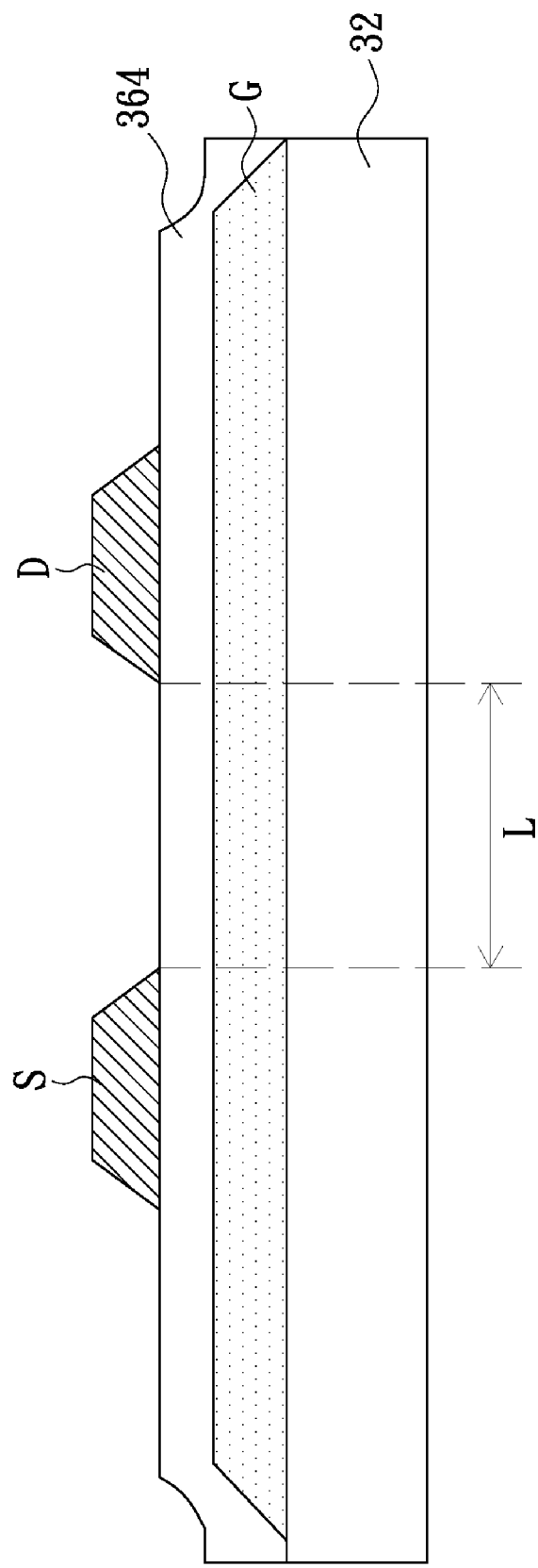

As shown in FIG. 5C, after that, a source electrode S and a drain electrode D is formed on the gate dielectric layer 364. The source electrode S is separated from the source D thereby forming a channel distance L.

Figure 5D:
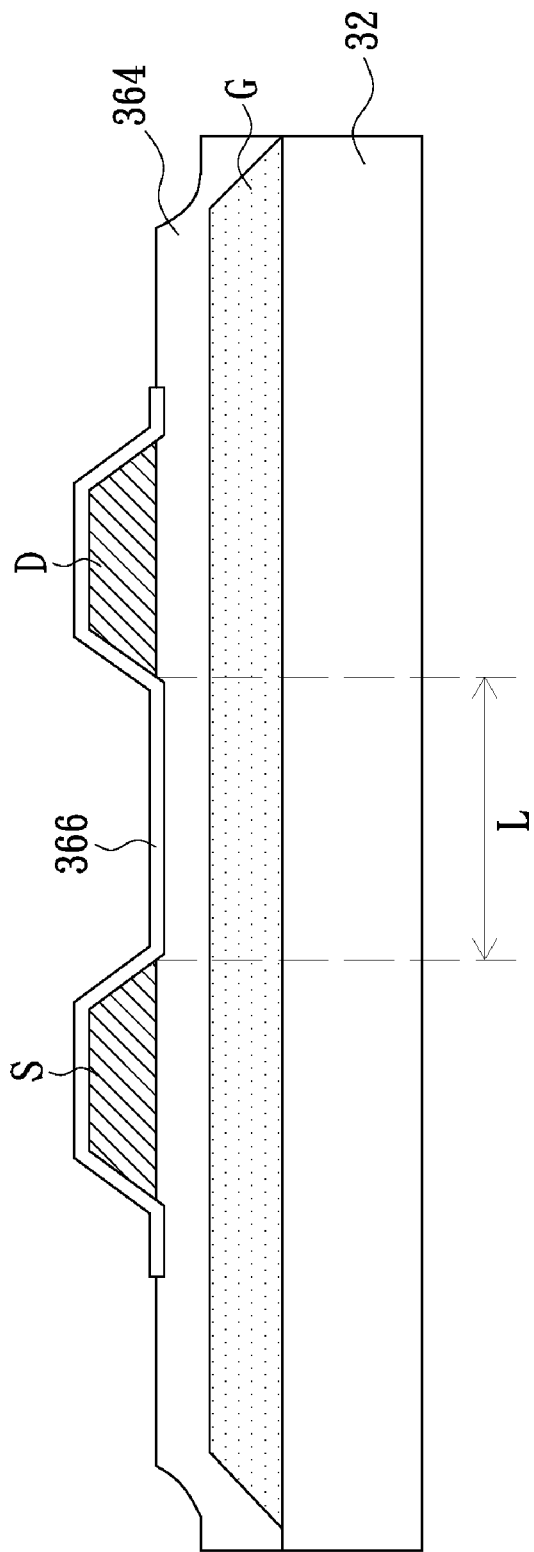

As shown in FIG. 5D, a oxide semiconductor layer 366 is formed on the gate dielectric layer 364, the source electrode S and the drain electrode D, and the oxide semiconductor layer 366 is also disposed between the source electrode S and the drain electrode D. In addition, the oxide semiconductor layer 366 is electrically connected to the source electrode S and the drain electrode D, and defines a channel layer between the source electrode S and the drain electrode D having the length of L. Here, a material of the oxide semiconductor layer 366 can be selected from the group consisting of indium gallium zinc oxide, other oxygen containing metal compound semiconductors, or the combination thereof.

Figure 5E:
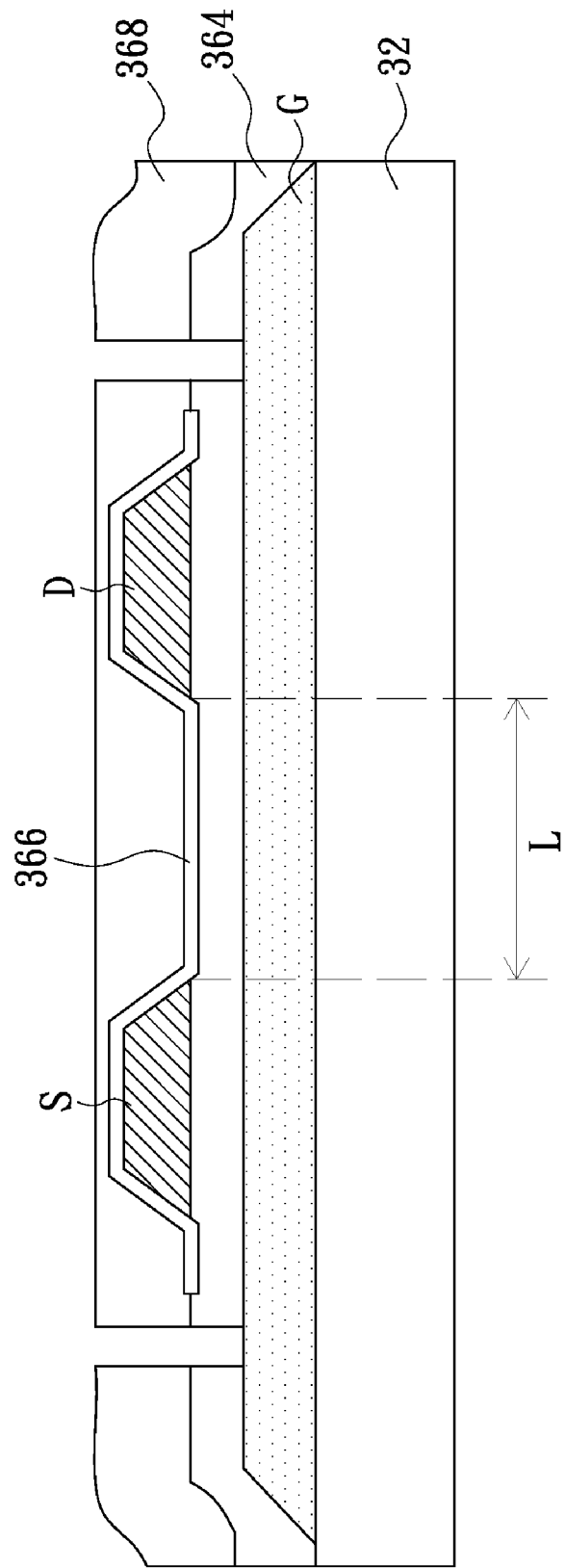

As shown in FIG. 5E, the passivation layer 368 is formed on the gate dielectric layer 364, the oxide semiconductor layer 366, the source electrode S and the drain electrode D. A material of the passivation layer 368 can be silicon oxide, silicon nitride, silicon oxynitride, or the combination thereof. Due to the manufacturing process, for example, silicone is employed in the manufacturing process, the passivation layer 368 usually contains free hydrogen, and the content of the free hydrogen is usually greater than that of the gate dielectric layer 364.

After that, the passivation layer 368 and the gate dielectric layer 364 are etched sequentially by using the gate electrode G as an etching stop layer to form the groove 361 in the passivation layer 368 and form the groove 363 in the gate dielectric layer 364. The groove 361 and the groove 363 are connected together and surround the oxide semiconductor layer 366 thereby obtaining the semiconductor device structure 30 as shown in FIG. 2. It is necessary to note that the method provided in the embodiment of the present invention can also only etch the passivation layer 368 to form the groove 361.

In another embodiment, the method for manufacturing the semiconductor device structure provided in the embodiment of the present invention can also further include forming another dielectric layer on the passivation layer 368, and the dielectric layer is disposed in the groove 361 and/or the groove 363 thereby obtaining the structure shown in FIG. 3.

In another embodiment, the method for manufacturing the semiconductor device structure provided in the embodiment of the present invention can also form the transparent conductive layer on the passivation layer 368 and the transparent conductive layer is placed in the groove 361 and/or the groove 363. When the transparent conductive layer is patterned a structure shown in FIG. 4 is obtained.

Figure 6:
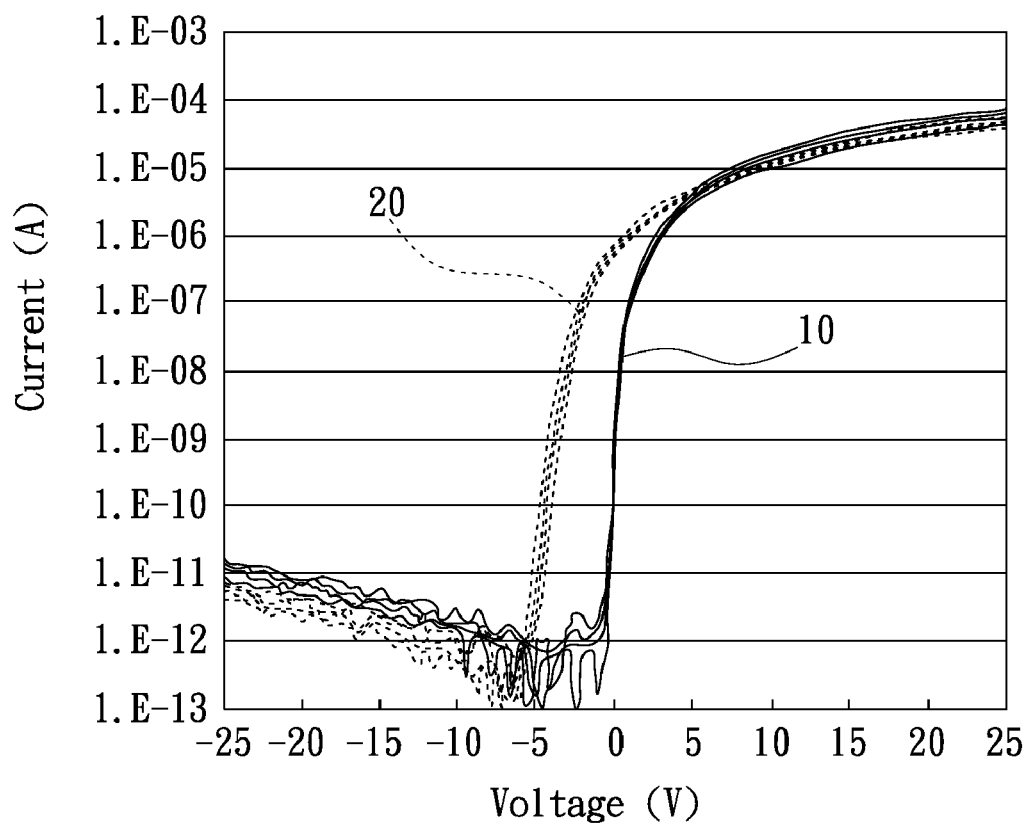
FIG. 6 is a schematic view showing relation of the voltage (V) to current (I) of the semiconductor device structure of the embedment of the present invention and the compared embodiment.

Referring to FIG. 6, FIG. 6 is a schematic view showing relation of the voltage (V) to current (I) of the semiconductor device structure of the embedment of the present invention and the compared embodiment. The structure of the semiconductor device structure in accordance with the embodiment of the present invention is different from that of the compared embodiment, wherein the gate dielectric layer 364 and the passivation layer 368 in accordance with the embodiment of the present invention includes grooves 361, 363 surrounding the oxide semiconductor layer, and the gate dielectric layer and the passivation layer in the compared embodiment don't have the groove that surrounds the oxide semiconductor layer. The curve of voltage-current relation of the semiconductor device structure in accordance with the embodiment of the present invention is the curve 10, and the curve of voltage-current relation of the semiconductor device structure in accordance with the compared embodiment is the curve 20.

As shown in FIG. 6, the semiconductor device structure of the compared embodiment has greater leakage current $I_{off}$, and the threshold voltage $V_{th}$ is near to negative values and not obvious. The electrical characteristic of the semiconductor device structure is not ideal. In comparison, the threshold voltage of the semiconductor device structure of the present invention is near to 0V, and has better sub threshold swing (S.S.), which owe to the grooves formed in the passivation layer containing free hydrogen in the embodiments of the present invention. Thus, the oxide semiconductor layer can not be easily reduced by the free hydrogen and therefore can be kept in the near semiconductor state. Accordingly, the semiconductor device structure of the present invention has better semiconductor characteristic.

In summary, the semiconductor device structure provided in the embodiments of the present invention and the manufacturing method utilize the groove at least in the passivation layer to block the spreading path of the free hydrogen to the oxide semiconductor layer. The oxide semiconductor layer won't be oxidized by the free hydrogen, or is just slightly oxidized by the free hydrogen. As such, the characteristic of the oxide semiconductor layer can be kept in the process for manufacturing the semiconductor device structure. Therefore, the semiconductor device structure of the embodiments of the present invention has better performance.

In addition, any one of skilled in the art can also appropriately vary the semiconductor device structure provided in the embodiments of the present invention and the manufacturing method, for example, to appropriately change the position of the oxide semiconductor layer, or to dispose the oxide semiconductor layer at the bottom of the source electrode and the drain electrode and electrically connect the oxide semiconductor layer to the source electrode and the drain electrode, etc.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A semiconductor device structure on a substrate, comprising:
    a gate electrode formed on the substrate;
    a first dielectric layer containing free hydrogen and covering the gate electrode;
    a source electrode formed on the first dielectric layer;
    a drain electrode formed on the first dielectric layer, and the drain electrode being separated from the source electrode and thereby forming a channel distance;
    an oxide semiconductor layer formed on the first dielectric layer, the source electrode and the drain electrode, and being disposed between the source electrode and the drain electrode, the oxide semiconductor layer being electrically connected to the source electrode and the drain electrode; and
    a second dielectric layer containing free hydrogen, the second dielectric layer covering the oxide semiconductor layer, the source electrode and the drain electrode, the second dielectric layer having a first groove, the first groove being disposed surrounding the oxide semiconductor layer.

2. The semiconductor device structure of claim 1, wherein a material of the oxide semiconductor layer comprises indium gallium zinc oxide.

3. The semiconductor device structure of claim 1, wherein the first dielectric layer further comprises a second groove connected to the first groove, the second groove exposing a portion of the gate electrode at the bottom of the second groove.

4. The semiconductor device structure of claim 3, further comprising a third dielectric layer formed on the second dielectric layer and being filled into the first groove and the second groove.

5. The semiconductor device structure of claim 4, wherein a material of the third dielectric layer comprises polyimide.

6. The semiconductor device structure of claim 3, further comprising a patterned transparent conductive layer formed on the second dielectric layer and is filled into in the first groove and the second groove.

7. The semiconductor device structure of claim 6, wherein a material of the patterned transparent conductive layer comprises indium tin oxide.

8. The semiconductor device structure of claim 6, wherein the patterned transparent conductive layer electrically contacts with the gate electrode through the first groove and the second groove.

9. The semiconductor device structure of claim 1, wherein the first groove comprises a first sub opening and a second sub opening apart from each other, the first sub opening and the second sub opening being located at two opposite sides of the oxide semiconductor layer.

10. The semiconductor device structure of claim 1, wherein the content of the free hydrogen in the second dielectric layer is greater than that of the first dielectric layer.

11. A semiconductor device structure on a substrate, comprising:
    a transistor formed on the substrate, the transistor comprising:
        a gate electrode formed on the substrate;
        a source electrode and a drain electrode formed on the substrate, the source electrode being separated from the drain electrode and thereby forming a channel distance;
        an oxide semiconductor layer formed between the source electrode and the drain electrode and electrically connecting to the source electrode and the drain electrode; and
        a gate dielectric layer disposed between the gate electrode and the oxide semiconductor layer, the source electrode, the drain electrode; and
    a passivation layer containing free hydrogen formed on the gate electrode, the gate dielectric layer, the source electrode, the drain electrode and the oxide semiconductor layer;
    wherein at least one of the gate dielectric layer and the passivation layer having a groove located at a periphery of the oxide semiconductor layer and surrounds the oxide semiconductor layer.

12. The semiconductor device structure of claim 11, wherein a material of the oxide semiconductor layer comprises indium gallium zinc oxide.

13. The semiconductor device structure of claim 11, further comprising a layer made of polyimide or indium zinc oxide be filled into the groove.

14. The semiconductor device structure of claim 11, wherein the groove comprises a first opening and a second opening apart from each other, the first opening and the second opening being respectively located at two opposite sides of the oxide semiconductor layer.

15. The semiconductor device structure of claim 11, wherein the groove penetrates through the gate dielectric layer and the passivation layer.

16. A method for manufacturing a semiconductor device structure on a substrate, comprising:
- forming a gate electrode on the substrate;
- forming a first dielectric layer containing free hydrogen to cover the gate electrode;
- forming a source electrode and a drain electrode on the first dielectric layer, the source electrode being separated from the drain electrode and thereby forming a channel distance;
- forming an oxide semiconductor layer on the first dielectric layer, the source electrode and the drain electrode, and between the source electrode and the drain electrode;
- forming a second dielectric layer on the first dielectric layer, the oxide semiconductor layer, the source electrode and the drain electrode; and
- etching the second dielectric layer to form a groove surrounding the oxide semiconductor layer.

17. The method of claim 16, further comprising etching through the second dielectric layer and the first dielectric layer sequentially by using the gate electrode as an etching stop layer.

18. The method of claim 16, further comprising forming a third dielectric layer on the second dielectric layer and filling the third dielectric layer into the groove.

19. The method of claim 16, further comprising forming a transparent conductive layer on the second dielectric layer and filling the transparent conductive layer into the groove.

20. The method of claim 19, wherein the transparent conductive layer penetrates through the groove to electrically contact with the gate electrode.

* * * * *